(12) United States Patent
Golan

(10) Patent No.: US 6,600,319 B2
(45) Date of Patent: Jul. 29, 2003

(54) MAGNETIC RESONANCE IMAGING DEVICE

(75) Inventor: Erez Golan, Tel Aviv (IL)

(73) Assignee: TopSpin Medical (Israel) Limited, Lod (IL)

(*) Notice: Subject to any disclaimer, the term of this patent is extended or adjusted under 35 U.S.C. 154(b) by 0 days.

(21) Appl. No.: 09/725,887

(22) Filed: Nov. 30, 2000

(65) Prior Publication Data

US 2001/0011889 A1 Aug. 9, 2001

(30) Foreign Application Priority Data

Dec. 8, 1999 (GB) .............................. 9929070

(51) Int. Cl.⁷ .................................. G01V 3/00
(52) U.S. Cl. ..................... 324/318; 324/303
(58) Field of Search ................. 324/318, 322, 324/306, 307, 309, 314, 312, 300, 303; 600/421, 423

(56) References Cited

U.S. PATENT DOCUMENTS

| | | | |
|---|---|---|---|
| 4,350,955 A | 9/1982 | Jackson et al. | |
| 4,542,343 A | 9/1985 | Brown | 324/307 |
| 4,590,427 A | 5/1986 | Fukushima et al. | |
| 4,629,986 A | 12/1986 | Clow et al. | |
| 4,656,425 A | 4/1987 | Bendel | 324/309 |
| 4,714,881 A | 12/1987 | Givens | |
| 4,717,876 A | 1/1988 | Masi et al. | |
| 4,717,877 A | 1/1988 | Taicher et al. | |
| 4,717,878 A | 1/1988 | Taicher et al. | |
| 5,023,554 A | 6/1991 | Cho et al. | |
| 5,050,607 A * | 9/1991 | Bradley et al. | 128/653 |
| 5,212,447 A | 5/1993 | Paltiel | |
| 5,280,243 A | 1/1994 | Miller | |
| 5,303,707 A | 4/1994 | Young | 324/309 |
| 5,304,930 A | 4/1994 | Crowley et al. | 324/309 |
| 5,390,673 A * | 2/1995 | Kikinis | 324/318 |
| 5,493,225 A | 2/1996 | Crowley et al. | 324/309 |
| 5,517,118 A | 5/1996 | Crowley et al. | 324/309 |
| 5,572,132 A | 11/1996 | Pulyer et al. | |
| 5,610,522 A | 3/1997 | Locatelli et al. | |
| 5,699,801 A | 12/1997 | Atalar et al. | |
| 5,767,675 A | 6/1998 | Crowley et al. | 324/309 |
| 5,935,065 A | 8/1999 | Rose, Jr. et al. | 600/421 |

FOREIGN PATENT DOCUMENTS

| | | |
|---|---|---|
| FR | 2 793 882 | 11/2000 |
| GB | 2 346 216 | 8/2000 |
| WO | 98 29639 | 7/1998 |

OTHER PUBLICATIONS

Kandarpa et al., "Prototype Miniature Endoluminal MR Imaging Catheter", *J. Vas. and Interventional Radiology*, vol. 4, pp. 419–427, (1993).

Kleinberg et al., "Novel NMR Apparatus for Investigation an External Sample", *Journal of Magnetic Resonance*, vol. 97, pp. 466–485, (1992).

Cooper et al., "Remote (inside–Out) NMR. I. Remote Production of a Region of Homogeneous Magnetic Field", *Journal of Magnetic Resonance*, vol. 41, pp. 400–405, (1980).

Abstract—Chaillout Jean-Jacques "NMR measurement of objects of substantial volume", (2000).

Marino, XP-000986387 "Enhanced coupling to small NQR samples using ferrite coils", *Journal of Molecular Structure*, 58:79–83 (1980).

* cited by examiner

*Primary Examiner*—Louis Arana
(74) *Attorney, Agent, or Firm*—Browdy and Neimark, P.L.L.C.

(57) ABSTRACT

A device and method for performing NMR measurements and imaging in a surrounding medium are presented. The method utilizes the detection of magnetic resonance signals from within at least one region of a primary, substantially non-homogeneous, external magnetic field.

40 Claims, 7 Drawing Sheets

MAGNETIC RESONANCE IMAGING DEVICE

FIELD OF THE INVENTION

This invention is generally in the field of Nuclear Magnetic Resonance (NMR) based techniques, and relates to a device and method for magnetic resonance imaging (MRI). Although not limited thereto, the invention is particularly useful for medical purposes, to acquire images of cavities in the human body, but may also be used in any industrial application.

BACKGROUND OF THE INVENTION

MRI is a known imaging technique, used especially in cases where soft tissues are to be differentiated. Alternative techniques, such as ultrasound or X-ray based techniques, which mostly utilize spatial variations in material density, have inherently limited capabilities in differentiating soft tissues.

NMR is a term used to describe the physical phenomenon in which nuclei, when placed in a static magnetic field, respond to a superimposed alternating (RF) magnetic field. It is known that when the RF magnetic field has a component directed perpendicular to the static magnetic field, and when this component oscillates at a frequency known as the resonance frequency of the nuclei, then the nuclei can be excited by the RF magnetic field. This excitation is manifested in the temporal behavior of nuclear magnetization following the excitation phase, which in turn can be detected by a reception coil and termed the NMR signal. A key element in the utilization of NMR for imaging purposes is that the resonance frequency, known as the Larmor frequency, has a linear dependence on the intensity of the static magnetic field in which the nuclei reside. By applying a static magnetic field of which the intensity is spatially dependent, it is possible to differentiate signals received from nuclei residing in different magnetic field intensities, and therefore in different spatial locations. The techniques which utilize NMR phenomena for obtaining spatial distribution images of nuclei and nuclear characteristics are termed MRI.

In conventional MRI techniques, spatial resolution is achieved by superimposing a stationary magnetic field gradient on a static homogeneous magnetic field. By using a series of excitations and signal receptions under various gradient orientations, a complete image of nuclear distribution can be obtained. Furthermore, it is a unique quality of MRI that the spatial distribution of chemical and physical characteristics of materials, such as biological tissue, can be enhanced and contrasted in many different manners by varying the excitation scheme, known as the MRI sequence, and by using an appropriate processing method.

The commercial application of MRI techniques suffers from the following two basic drawbacks: the expenses involved with purchasing and operating an MRI setup; and the relatively low signal sensitivity which requires long image acquisition time. Both of these drawbacks are linked to the requirement in standard MRI techniques to image relatively large volumes, such as the human body. This necessitates producing a highly homogeneous magnetic field over the entire imaged volume, thereby requiring extensive equipment. Additionally, the unavoidable distance between a signal receiving coil and most of the imaging volume significantly reduces imaging sensitivity.

There are a number of applications in which there is a need for imaging relatively small volumes, where some of the above-noted shortcomings may be overcome. One such application is geophysical well logging, where the "whole body" MRI approach is obviously impossible. Here, a hole is drilled in the earth's crust, and measuring equipment is inserted thereinto for local imaging of the surrounding medium at different depths.

Several methods and apparatuses have been developed, aimed at extracting NMR data from the bore hole walls, including U.S. Pat. Nos. 4,350,955; 4,629,986; 4,717,877; 4,717,878; 4,717,876; 5,212,447; 5,280,243; and "Remote 'Inside Out' NMR", J. Magn. Res., 41, p. 400, 1980; "Novel NMR Apparatus for investigating an External Sample", Kleinberg et al., J. Magn. Res., 97, p. 466, 1992.

The apparatuses disclosed in the above documents are based on several permanent magnet configurations designed to create relatively homogeneous static magnetic fields in a region external to the apparatus itself RF coils are typically used in such apparatuses to excite the nuclei in the homogeneous region and, in turn, receive the created NMR signal. To create an external region of a homogeneous magnetic field, the magnetic configurations have to be carefully designed, to reconcile the fact that small deviations in structure may have a disastrous effect on magnetic field homogeneity. It turns out that such a region of a homogeneous magnetic field can be created only within a narrow radial distance around a fixed position relative to the magnet configuration, and that the characteristic magnetic field intensities created in this region are generally low. As a result, such apparatuses, although permitting NMR measurements, have only limited use as imaging probes for imaging extensive regions of bore-hole walls.

With respect to medical MRI-based applications, the potential of using an intra-cavity receiver coil has been investigated, and is disclosed, for example, in the following publications: Kandarpa et al., J. Vasc. and Interventional Radiology, 4, pp. 419–427, 1993; and U.S. Pat. No. 5,699,801. Different designs for catheter-based receiver coils are proposed for insertion into body cavities, such as arteries during interventional procedures. These coils, when located close to the region of interest, improve reception sensitivity, thus allowing high-resolution imaging of these regions. Notwithstanding the fact that this approach enables the resolution to be substantially improved, it still suffers from two major drawbacks: (1) the need for bulk external setup in order to create the static homogeneous magnetic field and to transmit the RF excitation signal; and (2) the need to maintain the orientation of the coil axis within certain limits relative to the external magnetic field, in order to ensure satisfactory image quality. Because of these two limitations, the concept of an intra-cavity receiver coil is only half-way towards designing a fully autonomous intra-cavity imaging probe.

U.S. Pat. No. 5,572,132 discloses a concept of combining the static magnetic field source with the RF coil in a self contained intra-cavity medical imaging probe. Here, several permanent magnet configurations are proposed for creating a homogeneous magnetic field region external to the imaging probe itself, a manner somewhat analogous to the concept upon which the bore-hole apparatuses are based. Also disclosed in this patent are several RF and gradient coil configurations that may be integrated in the imaging probe in order to allow autonomous imaging capabilities. The suggested configurations, nevertheless, suffer from the same problems discussed above with respect to the bore-hole apparatuses, namely: a fixed and narrow homogeneous region to which imaging is limited, and low magnetic field values characteristic of homogeneous magnetic field configurations.

SUMMARY OF THE INVENTION

There is accordingly a need in the art to improve MRI based techniques, by providing a fully autonomous intracavity MRI probe and an imaging method.

The present invention is based on the realization that rather than attempting to overcome problems of non-homogeneity of the magnetic field, this non-homogeneity may be used to the advantage of high-resolution imaging. The imaging probe according to the invention comprises all components necessary to allow magnetic resonance measurements and imaging of local surroundings of the probe, obviating the need for external magnetic field sources. The imaging method is based on the non-homogeneous static magnetic field created by permanent magnets and on a high sensitivity RF coil block, all located in the imaging probe itself. This makes the imaging probe an autonomous high-resolution magnetic resonance imaging device, capable of imaging the medium surrounding the probe.

There is thus provided according to one aspect of the present invention, a method for detecting NMR signals coming from a medium, the method comprising:

(i) producing a primary, substantially non-homogeneous, external magnetic field in the medium;

(ii) detecting the magnetic resonance signals from within at least one region of said primary, substantially non-homogeneous magnetic field.

The method enables the simultaneous detection of NMR signals originating from nuclei residing in the non-homogeneous primary magnetic field, and characterized by a substantially wide frequency range with respect to a mean frequency value. The term "substantially wide frequency range" used herein signifies the wide frequency range as compared to that utilized by conventional techniques, which is limited to 1% of the mean value. Thus, the wide frequency range is, generally, more than 1% of the mean value.

According to another aspect of the present invention, there is provided a probe for producing Nuclear Magnetic Resonance (NMR) signals coming from a medium surrounding the probe and detecting the produced signals, the probe comprising:

a magnetic field-forming assembly that produces a primary, substantially non-homogeneous, external magnetic field; and a transceiver unit comprising at least one coil block capable of detecting magnetic resonance signals within at least one region of said primary magnetic field, said at least one region extending from the probe up to distances substantially of the probe dimensions.

The receiving coil block has sufficiently high sensitivity, namely such a sensitivity that enables the signal detection with sufficiently high signal-to-noise ratio from even a small volume cell of the medium located at a substantially large distance from the probe. For example, the following condition is indicative of the sufficiently high sensitivity: the NMR signal-to-noise ratio per volume cell (voxel) accumulated in a time frame of less than one minute (constituting the averaging time period) exceeding a value of five can be obtained, wherein the NMR signal part is originated from nuclei in the voxel of 0.1×0.2×1 mm in size located in the primary magnetic field at a distance up to the probe dimensions between the center of the voxel and the closest part of the probe. The noise part relates to the noise level of the coil block integrated over a frequency bandwidth equal to the bandwidth of the NMR signal originating from the same voxel.

Preferably, the coil block is composed of an RF coil, typically wound around a substantially toroidal core. The at least one region of the sufficiently high sensitivity is provided by forming the coil block with at least one narrow core gap, so that the gap plane is aligned substantially parallel to the direction of the primary magnetic field in the region of sufficiently high sensitivity. Several such spaced-apart core gaps may be provided so that more than one region of sufficiently high sensitivity can be created. The RF coil block may serve for both signal transmission (i.e., generates an RF magnetic field for exciting the nuclei), and for signal reception. Alternatively, the transceiver may comprise a separate element (e.g., coil block) for generating the transmission RF magnetic field.

Preferably, the field-forming assembly comprises two permanent magnets (which may be shaped as cylindrical rings) positioned in an axial, spaced-apart relationship on a common cylindrical ferromagnetic core, with their symmetry axes coinciding and defining the Z-axis, and a small inter-magnet gap remaining between the magnets. The magnets are magnetized along the X-axis perpendicular to the Z-axis and in opposite directions to each other, that is the N- and S-poles of one magnet face, respectively, the S- and N-poles of the other magnet. The assembly formed by the permanent magnets on the magnetic core creates the primary static magnetic field, which externally to the probe assembly and in the symmetry plane perpendicular to the Z-axis (hereinafter at times the "X-Y-plane") is directed substantially in the +/−Z direction with a maximum intensity obtained along the X-axis. The operation of the probe defines an imaging or measurement slice as the region where changes in the magnetic field component along the Z-axis are substantially small with respect to changes in the position along the Z-axis. By changing the size of the inter-magnet gap, the profile of the static magnetic field in the imaging slice can be varied. The RF coil block is preferably located in the gap between the magnets.

As for the RF coil block, when used for signal reception, the at least one region of the primary magnetic field from which the magnetic resonance signals are detected is located in proximity of the coil gap(s). In this region, the coil is substantially sensitive to variations in the transverse nuclear magnetization, i.e., in the X- or Y-component, depending on the RF-coil winding method. If the reception RF-coil block is used for transmission as well, the magnetic flux lines of the transmission magnetic field are substantially perpendicular to the Z-axis, and the transmission magnetic field intensity is highest in proximity of the coil gap(s). For both reception and transmission purposes, the at least one region of sufficient reception sensitivity and of maximum transmission intensity, respectively, can be visualized as at least one angular segment of the X-Y-plane, which is symmetrical with respect to the X-axis.

The field-forming assembly and the RF coil block may have the capability of revolving, together or separately, around the Z-axis. This revolution results in rotation of the angular segment(s), thereby scanning the imaging slice.

The device may also comprise a gradient coil to create variable magnetic field gradients in the lateral direction, i.e. perpendicularly to the radial direction and to the Z-axis (a so-called "ϕ-gradient coil").

The static magnetic field strength decreases with the increase of radial distance from the Z-axis, creating a substantially static magnetic field gradient in the radial direction. This can be utilized for creating a radial image dimension. When the probe is positioned at a fixed angle, i.e. without rotation about the Z-axis, the device can be used for obtaining pseudo-one-dimensional cross-sections of the surrounding medium residing substantially along the X-axis, i.e., along the radial passing through the RF-coil gap. An additional image dimension may be created by several techniques. As indicated above, one such technique utilizes a φ-gradient oil that can be added to the probe configuration, as a means to achieve lateral separation (i.e. in the φ direction). Alternatively, lateral separation may be achieved by other methods, such as angular selective excitation or special signal processing.

Preferably, the probe is slowly rotated around the symmetry axis. A wide-band (non-selective) multiple-spin-echo excitation scheme may be used to acquire the magnetic resonance signal created by nuclei in wide overlapping angular sectors external to the probe. The signals acquired may then be averaged in order to improve the signal-to-noise ratio, and processed to create a two-dimensional image in polar coordinates (r, φ).

The probe may be integrated into an intravascular catheter and used for imaging a series of 2-D cross-sections of blood vessel walls. The cross section images will extend appreciably into the vessel walls, providing high-resolution characterization of wall morphology, such as the structure and content of existing atherosclerotic lesions.

The imaging probe of the invention for intravascular medical use is included within a catheter that has preferably at least one hollow lumen to permit flow of blood therethrough. Such a hollow lumen may be achieved by the use of a hollow, e.g. tubular, magnetic core supporting the two magnetic field forming members (e.g., permanent magnets). A catheter probe in accordance with an embodiment of the invention comprises at least one inflatable balloon. When inflated, the balloon fixes the imaging probe to the vessel walls, minimizing relative motion during the time of image acquisition, while not obstructing the blood circulation.

The imaging probe may have a variety of different designs to meet particular applications, all being within the scope of the invention as defined herein. Variations may be in shape, cross section (tubular, cylindrical, rectangular, polygonal, etc.), proportions, size, material properties (mechanical, electromagnetic, etc.) and the like.

For example, the static field symmetric with respect to rotations about the Z-axis can be created. This can be achieved by magnetizing the "upper" magnet (i.e., one of the two magnets positioned on the Z-axis) radially outward and the "lower" magnet radially inward, leaving the ferromagnetic core unchanged. It can further obviate the need for rotating the magnetic structure.

Multiple high-intensity RF field segments or segments of substantially high sensitivity can be created, directed along a series of angles (for example: along 0, 45, 90, . . . , 315 degrees) covering the X-Y-plane. This will obviate the need for rotating the RF-coil block.

A "stack" of RF-coil blocks or of magnets/RF-coil blocks aligned along the Z-axis can be provided for the simultaneous imaging of multiple slices (X-Y-planes).

The preferred structure in terms of static magnetic field strength is the use of the original permanent magnets, having only solid cylindrical shapes (not rings) and no ferromagnetic core, or with a ferromagnetic core connecting two periphery regions of the magnets (not centered around the Z-axis). In this configuration, the RF-coil block is not necessarily a perfect toroid, but it is again in the inter-magnet, gap and the entire magnets-coil combination revolves, since both field patterns are not symmetric for rotations around the Z-axis.

All the above configurations can be made solid, namely without an internal lumen for blood flow. When such configurations are used for intravascular applications, blood flow can be allowed externally to the probe.

The above-described transceiver unit comprising a coil block having sufficiently high sensitivity for receiving magnetic resonance signals within at least one region of the primary magnetic field can be advantageously used in any MRI- or NMR-aimed device, irrespective of the homogeneity or non-homogeneity of the primary magnetic field, which can be created by an external static magnetic field source.

There is thus provided according to yet another aspect of the present invention, a transceiver unit for use in a probe for detecting NMR signals of a surrounding medium, the transceiver unit comprising at least one coil block capable of detecting magnetic resonance signals within at least one region of a primary external magnetic field, wherein said coil block comprises a coil wound on a substantially toroidal core having at least one core gap.

According to yet another aspect of the present invention, there is provided a device for NMR measurements or magnetic resonance imaging of a medium, the device comprising an imaging probe to be located in the vicinity of said medium and connected to a control station for generating transmission pulses, and for receiving, processing and displaying data generated by the probe, the probe comprising:

(a) a magnetic field forming assembly that produces a primary, substantially non homogeneous, external magnetic field in the medium; and (b) a transceiver unit comprising at least one coil capable of detecting magnetic resonance signals from within at least one region of said primary, substantially non-homogeneous magnetic field, said at least one region extending from the probe up to distances substantially of the probe dimensions.

Imaging of human blood vessels is a preferred embodiment of the invention and the description bellow refers specifically thereto. It should, however, be undoubtedly clear that the following description of the preferred embodiments does not limit the present invention, but rather serves only to illustrate the invention. It is clear that by routine design modifications, which are within the reach of the artisan, probes in accordance with the invention for other applications may be designed.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF A PREFERRED EMBODIMENT

Figure 1:
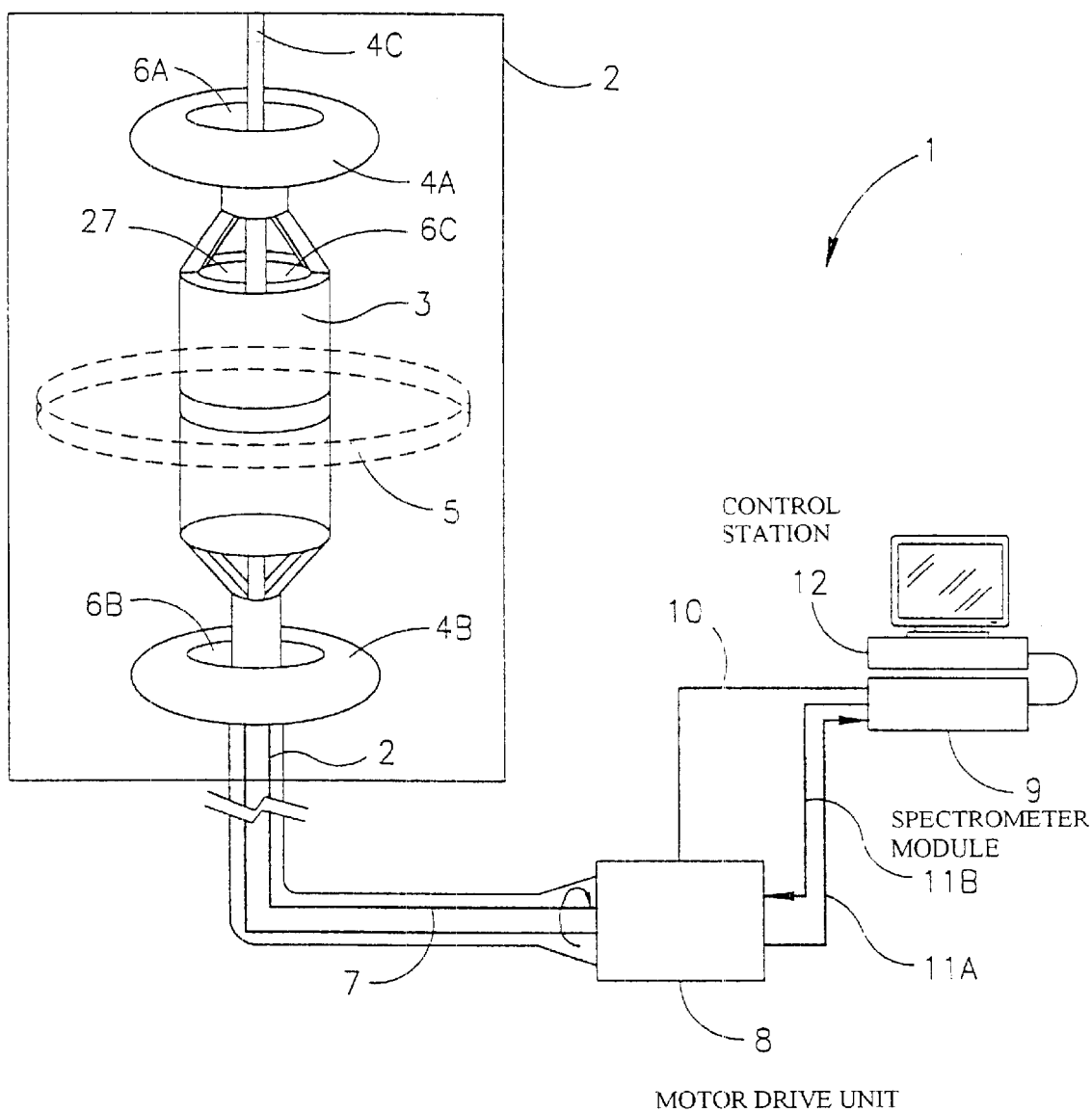
FIG. 1 is a schematic illustration of a device according to the invention utilizing an imaging probe integrated in an intravascular catheter.

Referring to FIG. 1, there is illustrated an MRI-based system for intravascular imaging, generally designated 1, utilizing an intravascular catheter 2 that comprises an imaging probe 3 and two inflatable balloons 4a and 4b. The catheter 2 is insertable towards a region of interest by "riding" on a pre-positioned guide-wire 4c. This is a known procedure in interventional cardiology, and therefore need not be elaborated further herein. To fix the relative position of the imaging probe 3 relative to the vessel walls (not shown), the perfusion balloons 4a and 4b are inflated until sufficient contact is achieved between the balloons and the vessel walls. The positioning and operation of the imaging probe 3 permits imaging of a region or slice 5 that intersects the vessel walls. The balloons positions are so designed that the shape distortion at both distal and proximal planes of contact of the wall will have a negligible effect on the original wall morphology at the imaging slice 5.

In this specific example, the balloons 4a and 4b have an annular shape and define openings 6a and 6b, respectively, and the imaging probe 3 is designed to have a lumen 6c so as to allow the continuous circulation of blood therethrough, both during an image acquisition phase and at all other time periods. Rather, there are lumens through probe 3, the imaging probe may include several inner liquid passageways to permit passage of various liquids, e.g. a contrasting agent, as well as through-flow of blood.

Further provided are leads 7 that run along the intravascular catheter 2 to and from the imaging probe 3 to connect it to a motor drive unit 8 located at the catheter's rear portion. The motor drive unit 8 serves to rotate the imaging probe 3 at the distal end of the catheter 2 around the Z-axis (see FIG. 2A), while image acquisition is in progress. It should be noted, although not specifically shown, that the motor drive unit 8 may also house a transmit/receive switching unit, a pre-amplification circuit or an amplifying unit for creating the required transmission pulses. Alternatively, although not specifically shown, the switching unit and the pre-amplifying components may be integrated into the catheter 2, in proximity to the imaging probe 3.

The motor drive unit 8 is controlled and powered by a spectrometer module 9 via cable 10. Receiving and transmitting channels, designated respectively 11a and 11b are also connected to the spectrometer module 9, which controls the synchronized transmit pulse generation, signal acquisition, imaging probe rotation and, possibly φ-gradient activation and level, as the case may be. The spectrometer 9 is further connected to a control station 12 (e.g., a personal computer), through which the operator interfaces with the system.

The system 1 operates in the following manner. When triggered by the operator, the acquisition process takes place by running the imaging sequence and collecting received signals while the imaging probe 3 is rotated, as will be described more specifically further below. In the end of the acquisition phase, the received signals are processed, and a high-resolution image of a cross section of the vessel contained in the imaging slice 5 can be displayed on a monitor of the control station 12. Multiple cross section images can readily be collected by moving the imaging probe 3 along the Z-axis. It should be noted, although not specifically shown, that the same can be achieved by using an array or "stack" of magnets/RF coil units aligned along the Z-axis. The so-obtained cross section images can be further processed to reconstruct 3-D) images of the vessel.

It should be noted that the imaging method may not require the mechanical rotation of the imaging probe 3. In this case, the motor drive unit 8 can be replaced by an alternative catheter interface unit, having mostly electrical functions (not shown).

Figure 2A:
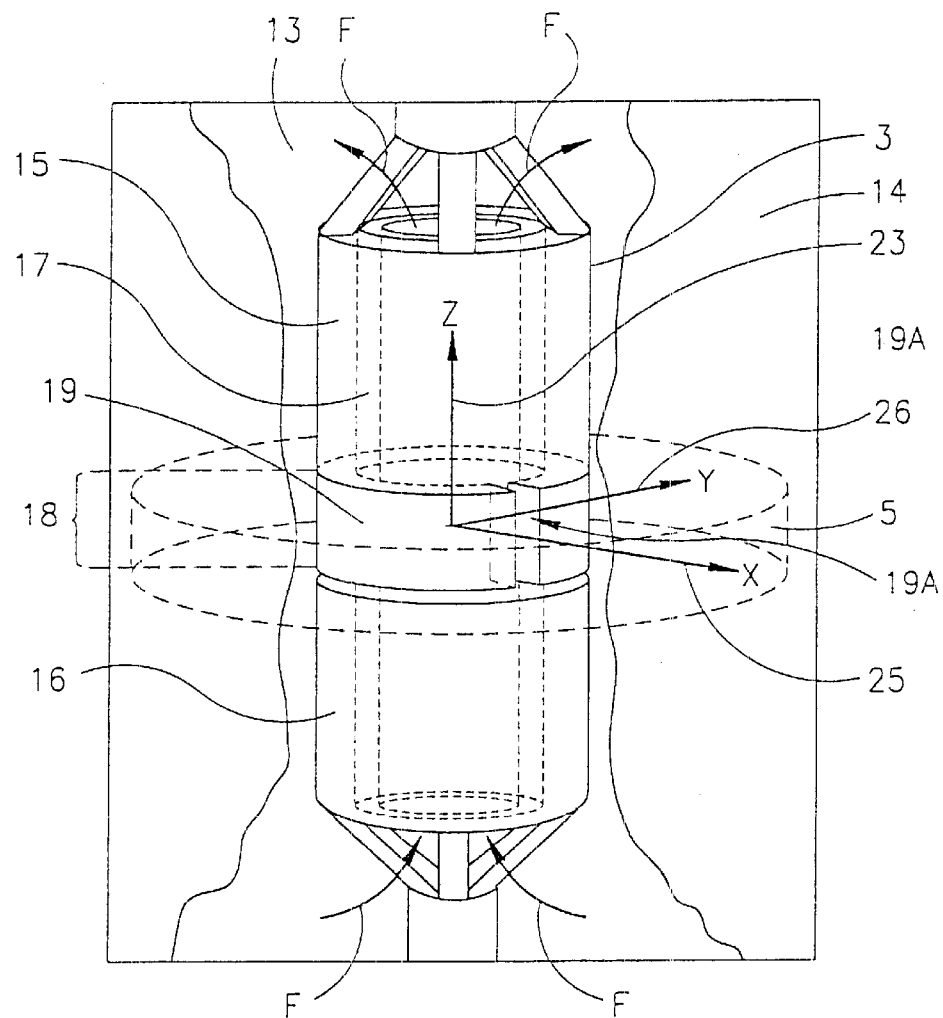
FIG. 2A more specifically illustrates the main components of the imaging robe of FIG. 1.

Turning now to FIG. 2A, the imaging probe 3 is more specifically illustrated. The perfusion balloons and the guide-wire are not shown here, solely to simplify the illustration of the main components of the imaging probe 3. The probe 3 is located in a blood vessel lumen 13, and is surrounded by vessel walls 14. The minimally obstructed flow of blood through the imaging probe 3 is shown by arrows F.

The imaging probe 3 comprises a magnetic field forming assembly composed of two permanent magnets 15 and 16 which, in the present example, have an annular shape, and are mounted on a hollow cylindrical magnetic core 17, leaving an inter-magnet gap 18 between them. The permanent magnets 15 and 16 can be made of a rare-earth magnetic material, such as NdFeB (Neodymium Ferrite Boron), and the magnetic core 17 can be made of a soft ferromagnetic material of relatively high permeability and high saturation flux density, such as sintered iron powder. Surrounding inter-magnet gap 18 is an annular virtual imaging slice 5.

It should however be noted that the permanent magnets 15 and 16 and the magnetic core 17 may have non-circular cross-sections. The permanent magnets 15 and 16 may be fixed differently to the magnetic core 17, as well as be movable with respect to one another and to the magnetic core 17. Alternatively, the core may be located off the Z-axis, may have a cross-section different from that described in the drawing, and the provision of any core is optional, as will be described below with reference to FIGS. 10a–10c. The permanent magnets may be solid (no lumen), have a different cross section or may be magnetized in a different direction (for example, radially outward/inward).

The Z-axis 23 is a symmetry axis of the cylindrical core 17 (and, consequently, of each of the magnets 15 and 16), and is perpendicular to the X-axis 25 and the Y-axis 26. The permanent magnets 15 and 16 are magnetized along the X-axis, i.e., perpendicularly to the Z-axis, and in opposite directions to each other: the N- and S-poles (not shown) of the magnet 15 face, respectively, the S- and N-poles (not shown) of the magnet 16.

Figure 3:
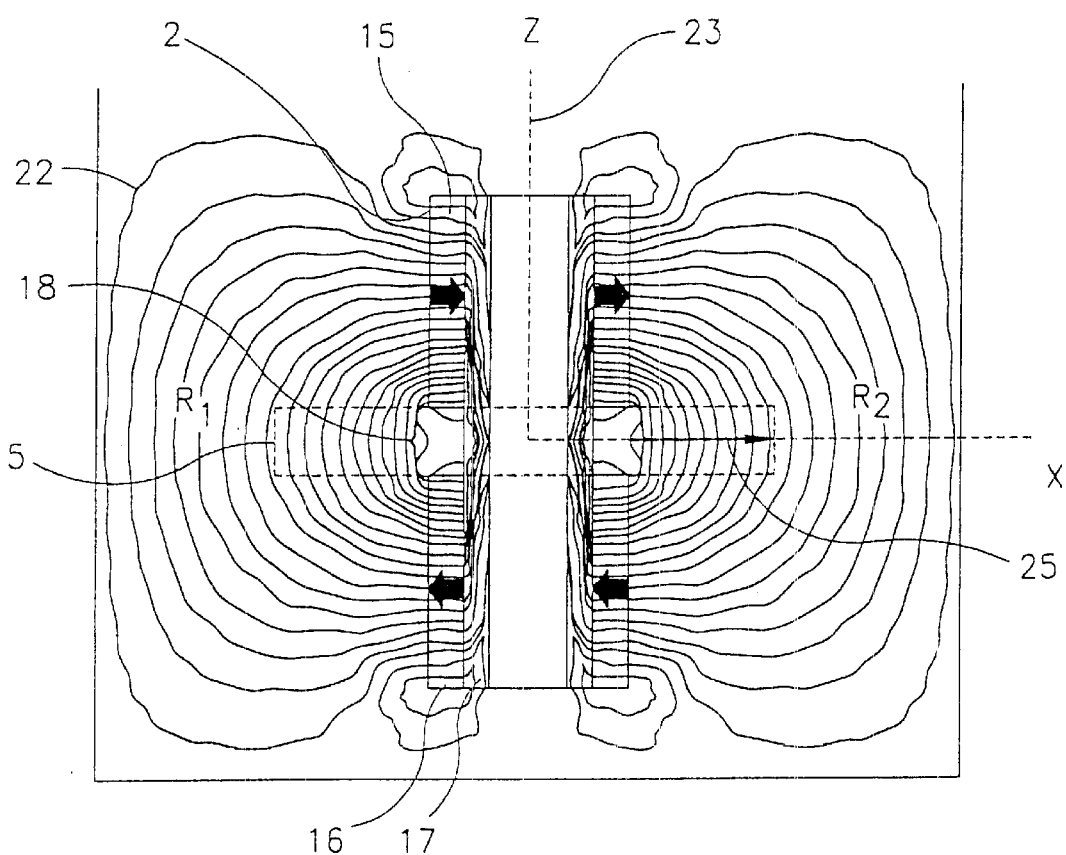
FIG. 3 is a cross-sectional view of the imaging probe of FIG. 2A showing the static magnetic field lines created by the primary magnetic field source.

As shown in FIG. 3, the magnetic configuration so created (i.e., by the first magnet 15, the second magnet 16 and the magnetic core 17) produces a static magnetic field (i.e., a primary magnetic field), having two regions $R_1$ and $R_2$ where static magnetic field lines 22 are directed substantially along the Z-axis 23. As shown, these regions $R_1$ and $R_2$ are aligned along the X-axis and located symmetrically with respect to the Z-axis, in the lateral space of the inter-magnet gap 18. The imaging slice 5 is formed by regions where changes in the magnetic fields Z-component are substantially small with respect to changes in the Z-position. By changing the size of the inter-magnet gap 18, the profile of the static magnetic field $B_0$ in the imaging slice 5 can be varied. A cross section of the imaging slice 5 in the figure plane is outlined.

Turning back to FIG. 2, an RF coil block 19, composed of an RF coil wound on a toroidal magnetic core, is mounted in the inter-magnets gap 18. As shown, the RF coil block 19 is designed so as to form a narrow coil gap 19a, the purpose of which will be explained further below.

It should be noted, although not specifically shown, that an "φ-gradient coil" may be added to the RF coil block. Furthermore, an additional and separate coil may be used for transmission The transmission coil may be wound around the receiver coil, wound as opposed rings above and below the X-Y-plane, wound around the permanent magnets ad core so to have a rectangular cross-section in the Y-Z-plane, etc. Some possible examples of the transmission coil geometry are described in the above prior art patents.

It should also be noted that the device can be utilized for obtaining pseudo-one-dimensional cross sections of the blood vessel wall by positioning the RF-coil gap 19a in the requested radial direction (a set angle in the X-Y-plane). The received NMR signal can be used to obtain one-dimensional profiles of material density and other physical characteristics.

For a given imaging probe 3 having a 3 mm outer diameter, the static magnetic field $B_0$ was calculated at points along a radial vector 25, which extends along the X-axis 25 starting at the X-position of the edges of the permanent magnets 15 and 16. The calculation results are graphically illustrated in FIG. 5. The calculated Z-component of the static magnetic field $B_Z$ as a function of the distance along the radial vector 25 (X-axis) can be seen. It is readily noticed that the magnetic field strength decreases substantially with the increase of the radial distance from the Z-axis, creating a static magnetic field gradient $$\frac{\partial B_z}{\partial x}.$$

According to the present invention, this magnetic field gradient is employed to advantage for imaging purposes, as will be described more specifically further below. It should be understood that the field profile depends on magnetic materials used in the magnetic field forming assembly.

In order to excite the nuclei in the imaging slice 5, an oscillating (RF) magnetic field, oriented perpendicularly to the static magnetic field, is, in one embodiment of the invention, created by the RF coil block 19 placed in the gap 18 between the magnets 15 and 16.

Figure 2B:
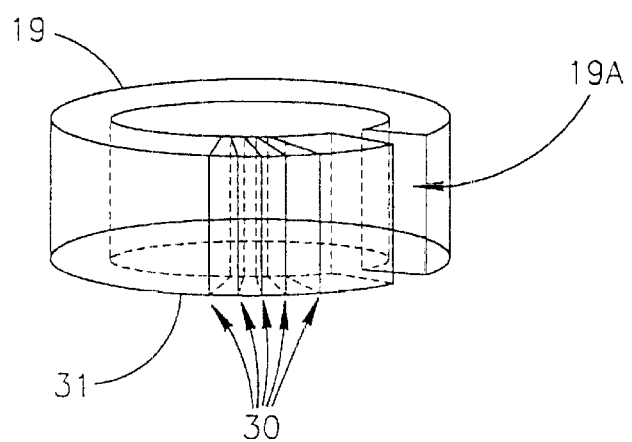
FIG. 2B is an enlarged view of an RF coil of the imaging probe of FIG. 2A.

Referring to FIG. 2B, the RF coil 19 is preferably wound around the toroidal core 31, as illustrated by a few representative coil windings 30. The toroidal core 31 is made of a ferrite material and has the narrow core gap 19a. The winding method can be either in a single direction along the toroid perimeter, in one or more layers, in groups of winding, or in any other manner well known in the art. The conducting wire can, alternatively, be wound in opposite directions, namely a right-hand-helix from the gap 19a along half of the toroid perimeter, and therefrom reversing winding direction to a left-hand-helix up until the other side of the gap 19a.

As shown in FIG. 2a, the RF coil 19 is preferably fixed to the magnetic core 17 so that the coil gap 19a is aligned with the X-axis 25. In other embodiments, such as where the static magnetic field is symmetric around the Z-axis, the RF-coil 19 may rotate separately from the rest of the probe 3 components.

Figure 4:
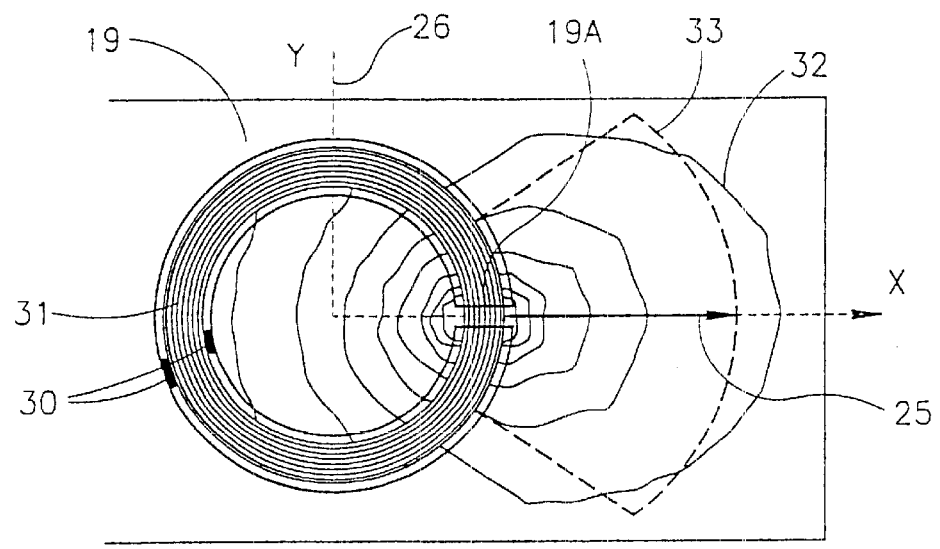
FIG. 4 is a cross-sectional view of the RF-coil of FIG. 2B, showing the RF magnetic field lines created when current is driven into the coil.

FIG. 4 illustrates a cross section of a preferred embodiment of the RF coil unit 19 in the X-Y ("imaging") plane, the X and Y axes marked 25 and 26 respectively. According to this specific example, the RF coil unit 19 is used for signal reception, and may also be used for transmission of excitation pulses. As indicated above, the construction of the imaging probe may be such that a separate coil is used for transmission. The magnetic core 17 is not shown in the cross-section for clarity. The RF coil unit 19, having a smooth circular cross-section in this embodiment, may alternatively have different cross-sections. The coil windings 30 may also vary in number, geometry, etc.

For illustrating the contribution of the RF coil 19 having the above-described geometry to its sensitivity when used as a reception coil, a situation in which a current is driven through the coil should be discussed. When used as a reception coil, a current is obviously not driven into the coil, but is rather induced in the coil by variations in external nuclear magnetization. However, the principle of reciprocity states that coil sensitivity to magnetic field variations at a certain point in space is directly proportional to the magnetic field produced at that same point by a unit current driven through the coil. The discussion below should be understood as an illustration only for describing coil sensitivity when used for reception purposes. In embodiments where the same coil is used for transmission, the situation of a current driven into the coil can be taken literally.

When a current is driven through the coil windings 30, a magnetic flux is created in the ferrite material through the toroidal core 31 and across the coil gap 19a. In a figurative way of speaking, the ferrite material in the toroidal core 31 effectively collects the magnetic flux produced by the coil current and concentrates it in the coil gap 19a. Stray flux lines 32 in the vicinity of the coil gap 19a produce a transverse magnetic field in the X-Y plane of a relatively high strength in comparison with alternative coil designs of similar dimensions, such as solenoids or saddle coils. When used for reception of alternating magnetic fields, such coil geometry provides an improved coil sensitivity, which allows high-resolution images to be obtained even at highly inhomogeneous magnetic fields. The segment-like region 33 is a region in the imaging slice 5 where the magnetic field is of sufficient strength, or, when used for reception, where sensitivity is sufficient. Varying the coil gap 19a size effects the RF magnetic field strength (or sensitivity) in the region 33.

It should be noted, although not specifically shown, that in embodiments where the conducting wire is wound in the opposed manner, as described above, the magnetic flux lines create a different pattern, having a predominant radial component along the X-axis.

Figure 6:
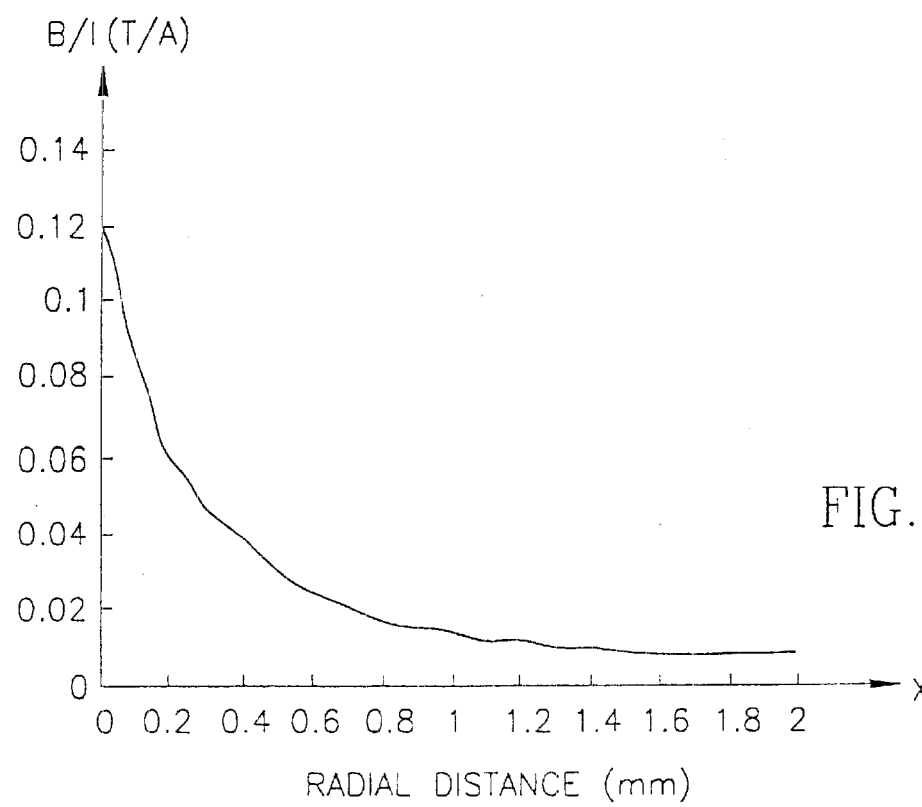
FIG. 6 exemplifies the RF magnetic field profile calculated along a radial vector for the imaging probe configuration of FIG. 2A, having an outer diameter of 3 mm.

FIG. 6 is a graphical representation of the RF magnetic field strength per unit current as calculated for various points along the radial vector 25 (X-axis) of an imaging probe 3 having a 3 mm outer diameter. It can readily be seen that the RF magnetic field is highly non-homogeneous, a factor which has to be taken into account in the imaging sequence and in a further signal processing method, as will be described further below. It should be understood that the present example relates to a specific choice of the geometry of the coil block 19, ferrite material, a coil winding method and the number of windings.

Figure 7:
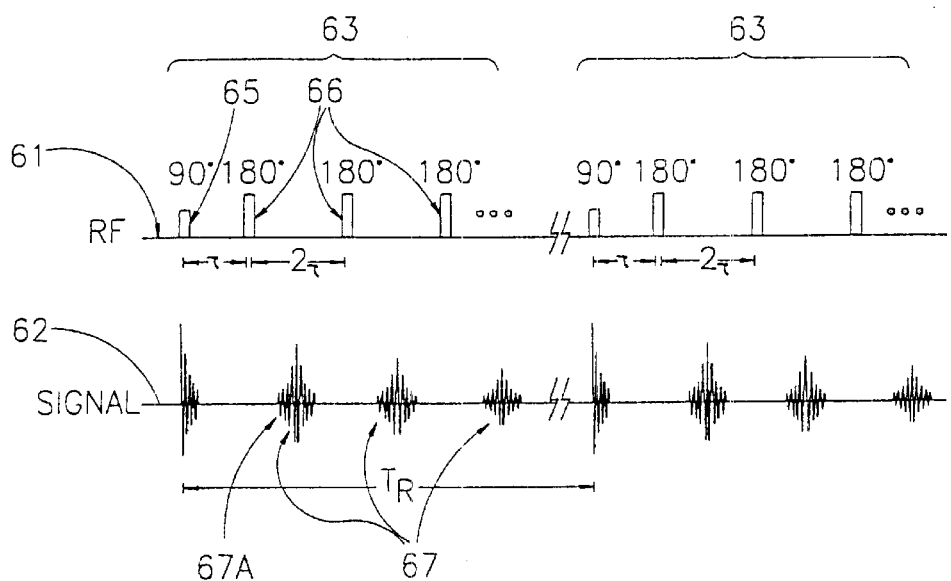
FIGS. 7 to 9 graphically illustrate the operational principles of the imaging e probe according to the invention.

An exemplary imaging method that may be used in accordance with the present invention is based on a sequence illustrated in FIG. 7, which is a variant of the Carr-Purcell-Meiboom-Gill (CPMG) sequence. The terminology and graphical method used to describe this sequence is known per se, and therefore need not be specifically described. The first graph 61 describes the time-base envelope of the transmitted RF pulses used to excite the nuclei. The second graph 62 is a qualitative sketch of the expected magnetic resonance signal. A series 63 of wide-band, non-selective (or "hard") RF pulses is preferably used to simultaneously excite nuclei in the entire imaging sector 33, so as to obtain a series of spin-echoes 67. One alternative for obtaining the spin-echoes 67 is the transmission of a 90° RF pulse 65 followed by a series of 180° RF pulses 66, using the time delays given in graph 61. It should, however, be noted that numerous other excitation schemes are applicable for obtaining a series of spin-echoes 67, and can therefore be used for the purposes of the present invention. Sequences based on magnetization tilt angles different than 90° and 180°, on stimulated echoes, and on variations in pulse timing and phase are few examples of many different sequences well known in the art, which can be used in accordance with the present invention.

The spin-spreading, which is rephased at each echo center, stems predominantly from the strong x-gradient in the static magnetic field, which exists permanently in the imaging sector 33. By reference to FIG. 5, which relates to one specific example of the present invention, this gradient can be estimated at around 100 Tesla/meter, corresponding to a magnetic resonance frequency range of 3.5 MHz to 8.5 MHz for nuclei in an imaging sector 33 of a 2 mm radial dimension. It is thus evident that the method according to the invention enables to simultaneously operate within a substantially wide frequency bandwidth of the magnetic resonance signals with respect to the mean frequency value. In the present example, this frequency bandwidth is approximately 100% of the mean frequency value. In general, the method of the invention enables to successfully operate in most any non-homogeneous magnetic field that ensures a sufficiently high signal-to-noise ratio, whereas conventionally known techniques are limited to the NMR frequency bandwidth of less than 1% of the mean frequency value.

It will be understood that one-dimensional (1-D) spin-density profiles of the imaging sector 33 can readily be obtained by sampling the echo signal (67a in FIG. 7, for example), using typical τ values and acquisition window sizes of several microseconds, and transforming it using a Fourier transform based algorithm. The fact that the static magnetic field profile (FIG. 5) is not perfectly linear can be readily compensated for during post-processing.

The relatively short τ values make possible the acquisition of a few thousands of spin-echoes 67 in one excitation series 63, having the duration of a typical transverse relaxation time (known as $T_2$). The multiplicity of spin-echoes 67 acquired can be averaged prior to any transformation in order to improve the signal-to-noise (S/N) ratio and, as a result, the quality of the final image.

In accordance with the present invention, several methods are available for obtaining two dimensional (2-D) images of the imaging slice 5. One type of methods utilizes an integrated φ-gradient coil, of which one suggested design is disclosed in the above-indicated U.S. Pat. No. 5,572,132. Simpler gradient coil designs are also possible since it is sufficient to control the gradient profile over the imaging sector 33 alone. An alternative method for obtaining lateral (φ) separation, which may obviate the need for a φ-gradient coil, utilizes processing of phase variations in the receive signals acquired from overlapping imaging sectors (not shown) as the imaging probe 3 is rotated around its axis 23. Possible RF pulse series to be used for exciting nuclei in consecutive, preferably overlapping, imaging sectors are represented by 63 and 64 in FIG. 7. The time separation between the series 63 and 64 is labeled $T_R$.

In both methods, a slow rotation of the imaging probe can be used to collect data from imaging sectors 33 covering the entire imaging slice 5. This data can then be processed and displayed as a 2-D ) image.

Two aspects of the previously mentioned RF magnetic field inhomogeneity will now be considered. The first one covers the effect of non-uniform excitation in wide-band excitation schemes, for cases where the RF coil block 19 having the filed profile of FIG. 6 is utilized for transmission purposes. Several phase-cycling techniques exist and are well known in the art, which can effectively compensate for non-uniform excitation. An alternative method may be employed for minimizing the effective RF magnetic field inhomogeneity by using tailored transmission RF waveforms. In reference to FIGS. 5 and 6, a spectral distribution of the RF magnetic field strength can be calculated, i.e. the relative RF magnetic field strength at each magnetic resonance frequency. Inverting the calculated spectral distribution yields the pulse spectrum required for obtaining a uniform excitation.

Figure 5:
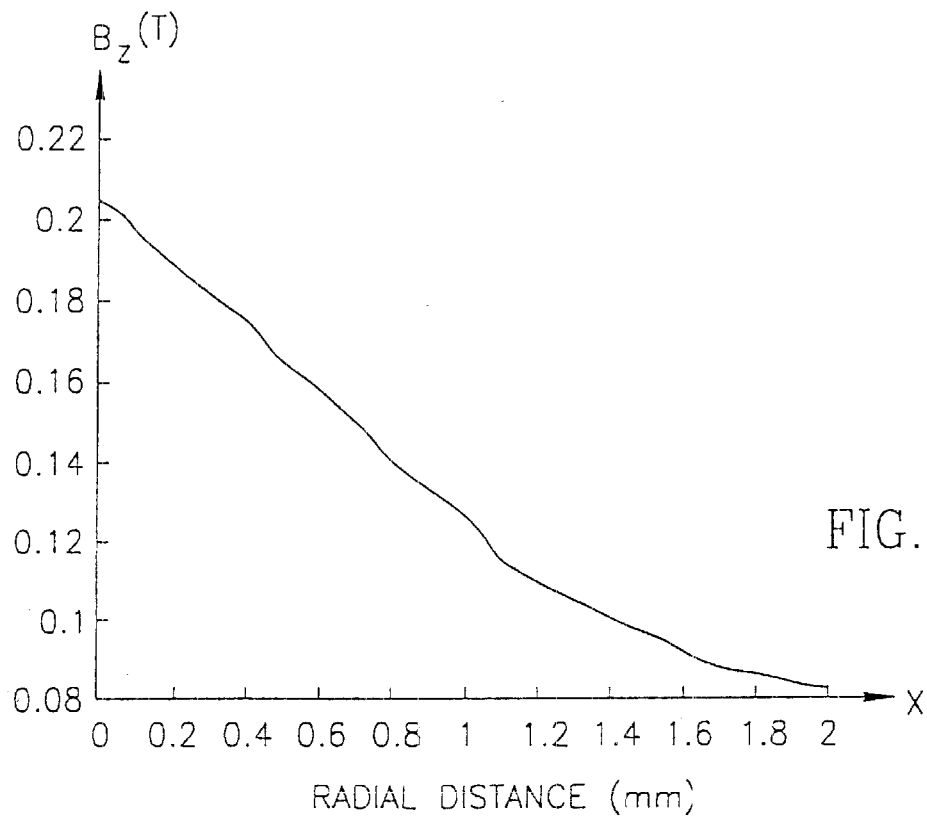
FIG. 5 exemplifies the static magnetic field profile calculated along a radial vector for the imaging probe configuration of FIG. 2A having an outer diameter of 3 mm.
Figure 8:
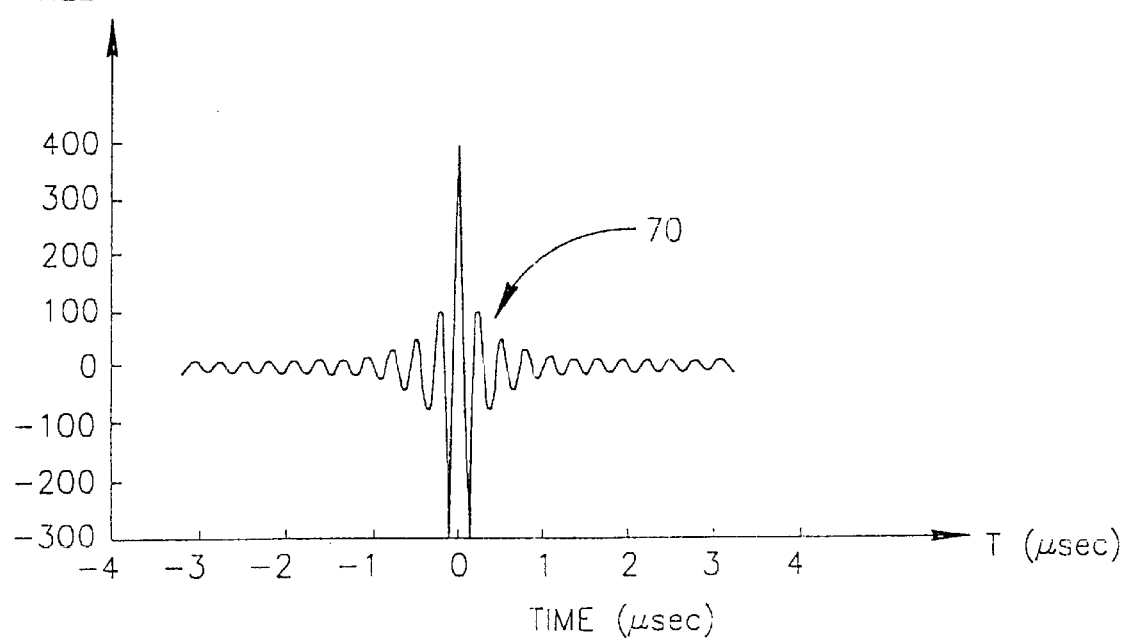

FIG. 8 illustrates a graph 70 corresponding to an RF waveform calculated in this manner for the typical magnetic field profiles given by the graphs of FIGS. 5 and 6. The calculated RF (current) waveform is displayed in relative units vs. a time base in microseconds. Replacing the rectangular enveloped RF pulses 65 and 66 in the sequence 60 by the calculated RF waveform of an appropriate level will create an effectively uniform RF magnetic field throughout the imaging sector 33.

Figure 9:
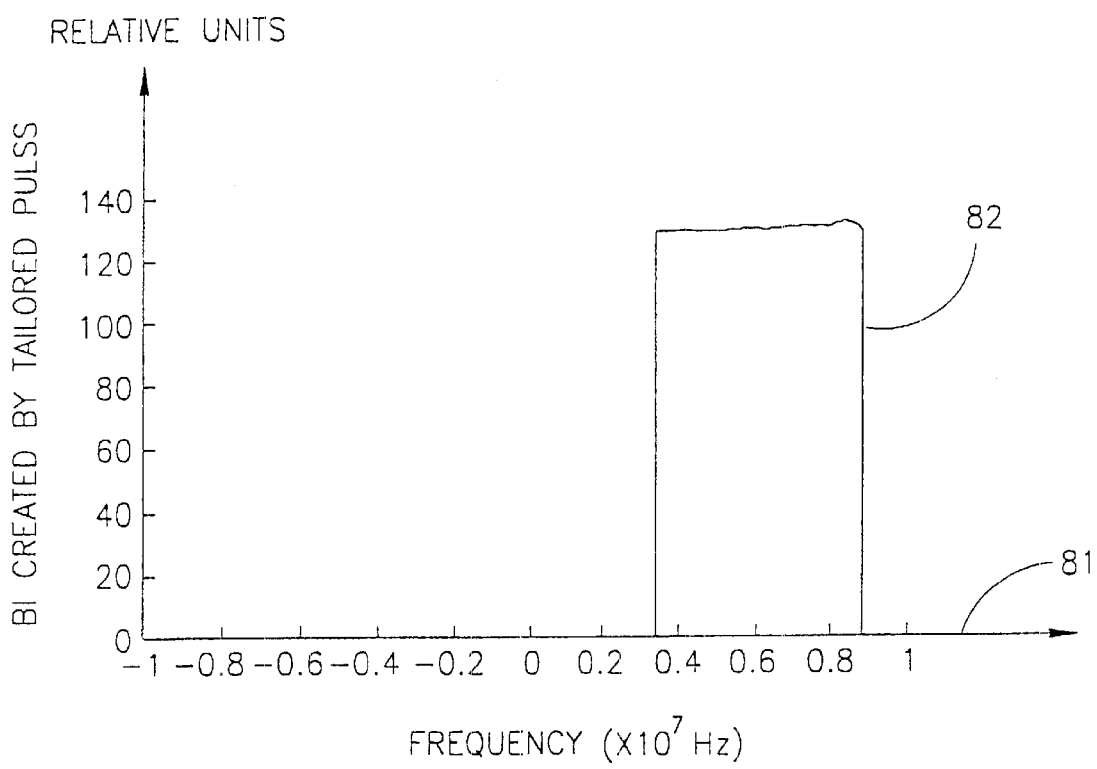

FIG. 9 illustrates the relative RF magnetic field strength 82, created by the calculated RF waveform vs. the magnetic resonance frequency scale 81. Uniformity of the relative RF magnetic field strength 82 can be readily observed in the magnetic resonance frequency range of 3.5 to 8.5 MHz, characterizing nuclei in the imaging sector 33 of an imaging probe 3 of 3 mm outer diameter.

A second effect of RF magnetic field non-homogeneity, when the RF coil block is used for signal reception, is the existence of spacially dependent coil sensitivity. The effect of variable sensitivity on signal intensity across the image can be readily compensated for during the processing stage, at the expense of enhanced noise levels in image regions characterized by poor sensitivity.

Figure 10C:
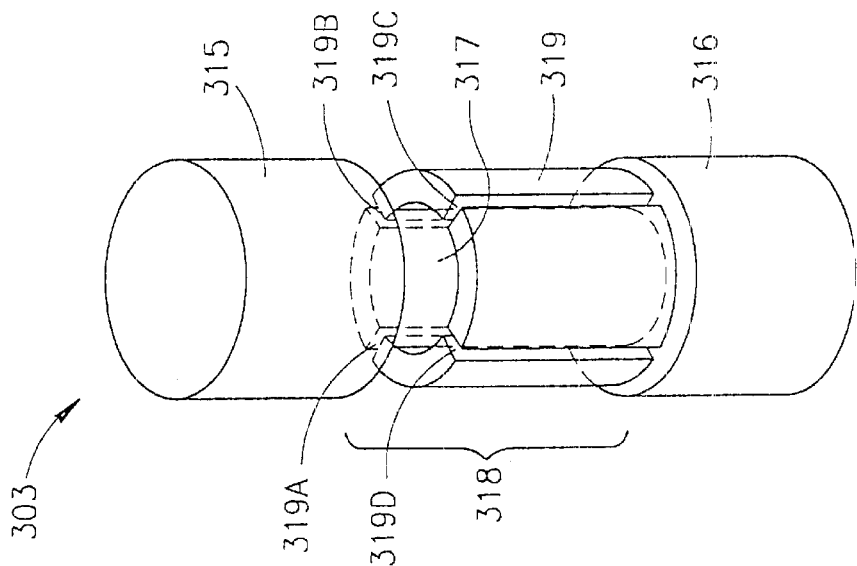
FIGS. 10a to 10c illustrate three more embodiments of the imaging probe, respectively, suitable to be used in the device of FIG. 1.
Figure 10B:
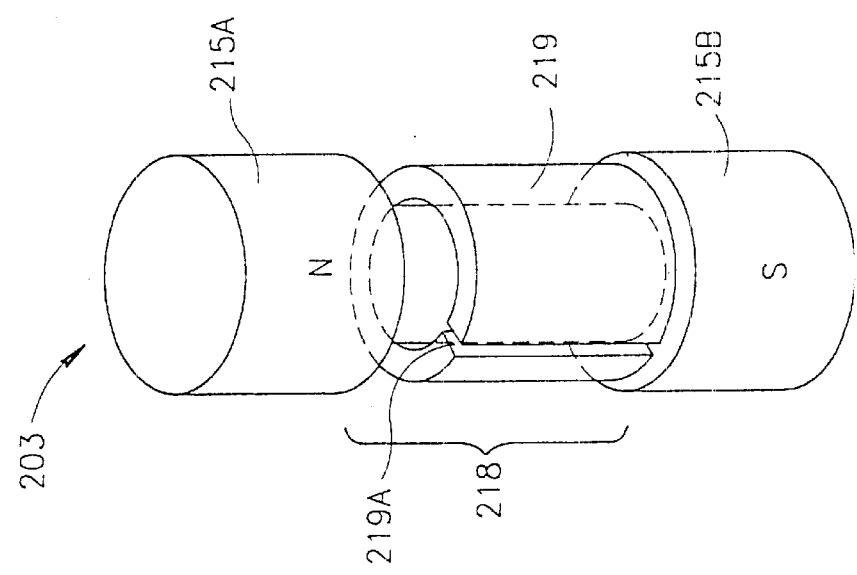
Figure 10A:
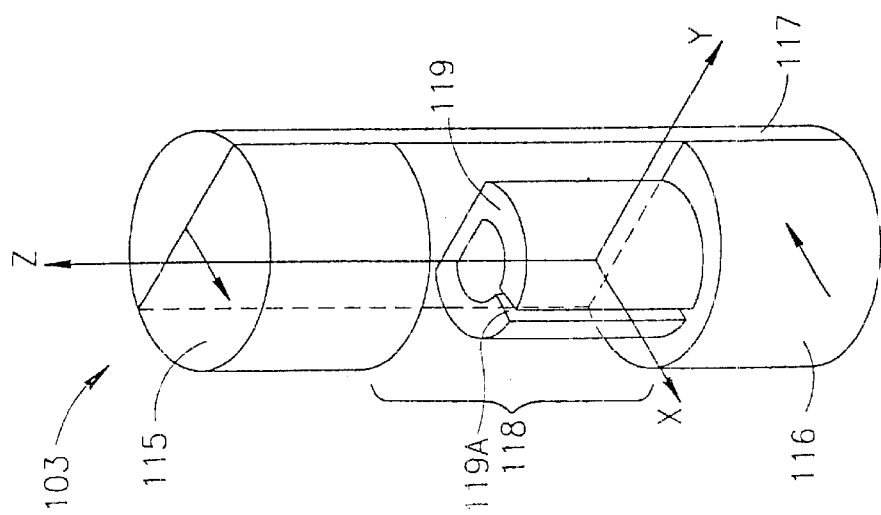

Turning now to FIGS. 10a–10c, there are illustrated three different examples, respectively, of alternative constructions of an imaging probe suitable to be used in the MRI-based system, for example, the system of FIG. 1.

According to the example of FIG. 10a, an imaging probe 103 comprises two permanent magnets 115 and 116 mounted on a magnetic core 117, which, in distinction to the previously described example, connects the periphery regions of the magnets rather than their central regions. The magnets are magnetized along the X-axis, the magnet 115 along the +X and the magnet 116—along the –X direction, and spaced from each other along the Z-axis to form an inter-magnet gap 118 in which an RF coil block 119 is accommodated. As shown, the coil block 119 has a coil gap 119a.

In the example of FIG. 10b, an imaging probe 203 comprises a magnetic field forming assembly formed by a single permanent magnet 215 having a thinner region 218 between its two poles 215a and 215b. The magnet 215 is magnetized along the Z-axis. An RF coil block 219 is positioned in the X-Y plane such that its coil gap 219a is located proximate to the magnet gap 218.

According to the example of FIG. 10c, an imaging probe 303 comprises two spaced-apart axially oriented permanent magnets 315 and 316 mounted on a magnetic core 317, for example, connecting their central regions. As for the RF coil block 319, it is formed with four spaced-apart coil gaps 319a, 319b, 319c and 319d.

It should be understood that the above construction of the RF coil block 319 is suitable for any possible geometry of the magnetic field forming assembly. Moreover, the RF coil block according to the invention, namely formed with at least one coil gap arranged in a plane substantially perpendicular to the imaging plane (Z-plane) can be advantageously used with any magnetic field forming assembly producing either homogeneous or non-homogeneous primary magnetic field.

Generally speaking, any design of the probe is possible, provided that: the RF coil block has the region of the sufficiently high sensitivity, the primary static magnetic field is substantially perpendicular to the RF field (which would have been created if a current was to be driven into the RF coil) at any point in this region, and the combination of the static field intensity and the RF coil sensitivity is sufficiently high to obtain the required signal-to-noise ratio. For imaging purposes, the static field pattern (combined with field gradients, if any) should allow the required mapping, i.e., points which are to be resolved in the image can be subjected to distinct static field values.

In accordance with the present invention, the MRI probe enables imaging either from within cavities in the human body, or by immersion in any medium to be tested, or in any other industrial application. Adaptation of the invention for a specific application can be accomplished by means of variations in most of the imaging probe characteristics. Also, the imaging method can be varied in accordance with the imaging requirements of the specific application.

The advantages of the present invention are thus self-evident. The provision of a sufficiently high sensitivity receiving coil block enables operation with an extremely non-homogeneous static magnetic field. The non-homogeneity of the static magnetic field allows for advantageous use of more extremely multiple echo averaging for imaging purposes. The provision of the high sensitivity reception coil enables to significantly improve the image resolution. Pulse shaping allows for compensating for non-homogeneous transmission RF fields. The single-gap coil block enables to obtain 1-D images without the coil rotation, and rotation is required in cases where 2-D imaging is to be achieved. Rotation is required only for those magnetic field sources, which create fields asymmetric for rotation about the Z-axis. If the static field is symmetric, the permanent magnet(s) may not be rotated. Similarly, if multiple coil gaps create imaging sectors which cover the entire 360° space, the coil block may not be rotated. Rotation of the permanent magnets and/or the coil block is therefore only a minor and certainly not an essential part of the invention.

Those skilled in the art will readily appreciate that various modifications and changes can be applied to the preferred embodiments of the invention as hereinbefore exemplified without departing from its scope defined in and by the appended claims.

What is claimed is:

1. A method for detecting NMR signals coming from a human body, the method comprising:
   (i) producing a primary, substantially non-homogeneous magnetic field in the human body; and
   (ii) substantially simultaneously detecting the magnetic resonance signals from within at least one substantially non-homogeneous region of said primary, substantially non-homogeneous magnetic field.

2. The method according to claim 1, wherein said simultaneously detected NMR signals are of a substantially wide frequency bandwidth with respect to their mean frequency value.

3. The method according to claim 2, wherein said substantially wide frequency bandwidth is greater than 1% of the mean frequency value.

4. The method according to claim 1, further comprising reconstructing a multi-pixel image portion from said detected signals.

5. The method according to claim 1, wherein the magnetic resonance signals produced by the application of said time-varying magnetic field are in the form of echo signals, said magnetic resonance signals being detected by utilizing a multiple pulse sequence with X values in the order of microsecond, thereby enabling acquisition of more than 10 echo signals during a typical transverse relaxation time ($T_2$).

6. The method according to claim 5, wherein said sequence is a variant of the Carr-Purcell-Meiboom-Gill (CPMG) sequence.

7. The method according to claim 1 wherein the primary magnetic field extends around a longitudinal axis and the at least one region extends transversely to said longitudinal axis across primary magnetic field lines that extend substantially parallel to the longitudinal axis.

8. The method according to claim 1, wherein said simultaneously non-homogeneous region is a high gradient region.

9. A probe for use in a device for detecting NMR signals originating from a medium surrounding the probe and detecting the produced signals, the probe comprising:
   a magnetic field-forming assembly that produces a primary, substantially non-homogeneous magnetic field in the medium; and
   at least one coil block in combination with signal processing circuitry connected to receive signals from said coil block and capable of substantially simultaneously detecting magnetic resonance signals within at least one substantially non-homogeneous region of said primary magnetic field;
   wherein the probe is adapted for use in a human body.

10. The probe according to claim 9, wherein said at least one region is located at a distance from the probe surface up to a distance substantially of the probe dimensions.

11. The probe according to claim 9, wherein said at least one region has dimensions of substantially the probe dimensions.

12. The probe according to claim 9, wherein said at least one coil block is formed with at least one coil gap, the gap plane being aligned substantially parallel to the direction of the primary magnetic field in said at least one region.

13. The probe according to claim 12, wherein said at least one coil block comprises a coil wound on a magnetic core having a non-continuous substantially toroidal shape defining said at least one coil gap.

14. The probe according to claim 12, wherein said at least one region is in the form of a segment extending radially from said at least one coil gap.

15. The probe according to claim 14, wherein said magnetic field forming assembly comprises two magnets mounted on a common magnetic core and arranged in a spaced-apart axial relationship along the Z-axis, defining an inter-magnet gap therebetween, said at least one segment extending radially from said at least one coil gap towards a slice defined by a radial space surrounding the inter-magnet gap.

16. The probe according to claim 15, wherein said magnets are permanent magnets.

17. The probe according to claim 15, wherein said magnets are substantially cylindrical.

18. The probe according to claim 17, wherein said magnets are tubular.

19. The probe according to claim 15, wherein said magnets are magnetized in opposite directions along an axis perpendicular to the Z-axis, thereby producing the primary external magnetic field substantially parallel to the Z-axis.

20. The probe according to claim 15, wherein said magnets are radially magnetized in opposite directions, such that one of the magnets is magnetized in a radially inward direction and the other magnet is magnetized in the radially outwards direction.

21. The probe according to claim 9, being rotatable so as to provide rotation of is said at least one region through the surrounding medium.

22. The probe according to claim 9, being displaceable relative to the surrounding medium.

23. The probe according to claim 9, wherein said transceiver unit comprises at least one additional coil block capable of detecting the NMR signals within at least one addition region of said primary magnetic field.

24. The probe according to claim 9, and also comprising at least one additional magnetic field forming assembly with a corresponding at least one additional coil block.

25. The probe according to claim 9, wherein said at least one coil block also serves for signal transmission, being thus capable of generating an oscillating magnetic field producing said magnetic resonance signals.

26. The probe according to claim 9, for use in medical equipment for NMR signal detection, wherein said probe is a catheter, said magnetic field forming assembly and said at least one RF coil block being housed within said catheter.

27. The probe according to claim 26, having a hollow lumen to allow blood flow therethrough.

28. The probe according to claim 26, being integrated in a medical catheter-based therapeutic or diagnostic device.

29. A device for magnetic resonance imaging of a medium, the device comprising an imaging probe to be located in the vicinity of said medium and connected to a control station for generating RF transmission pulses, and for receiving, processing and displaying data generated by the probe, the probe comprising:

(a) a magnetic field forming assembly that produces a primary, substantially non-homogeneous magnetic field, suitable for imaging, in the medium; and (b) a transceiver unit, suitable for imaging, operable to generate a time-varying magnetic field to excite at least one substantially non-homogeneous region of the magnetic field to thereby produce magnetic resonance signals from within the at least one substantially non-homogeneous region of the primary, substantially non-homogeneous magnetic field, and comprising at least one coil in combination with signal processing circuitry connected to receive signals from said coil and capable of substantially simultaneously detecting the magnetic resonance signals from within the at least one region of said primary, substantially non-homogeneous magnetic field;

wherein the probe is adapted for use in a human body.

30. The device according to claim 29 wherein the magnetic resonance frequency bandwidth of the magnetic resonance signals detected by said coil is not less than 1% of a mean frequency value of said detected magnetic resonance signals.

31. The probe according to claim 29, wherein said at least one region is located at a distance from the probe surface up to a distance substantially of the probe dimensions.

32. A device for NMR measurements in a medium, the device comprising a probe to be located in the vicinity of said medium and connected to a control station for generating transmission pulses, and for receiving, processing and displaying data generated by the probe, the probe comprising:

(a) a magnetic field forming assembly that produces a primary, substantially non-homogeneous magnetic field in the medium; and (b) a transceiver unit operable to generate a time-varying magnetic field to excite at least one substantially non-homogeneous region of the static magnetic field to thereby produce magnetic resonance signals from within said at least one substantially non-homogeneous region, and comprising at least one coil in combination with signal processing circuitry connected to receive signals from said coil and capable of substantially simultaneously detecting the magnetic resonance signals from within said at least one region of said primary, substantially non-homogeneous magnetic field;

wherein the probe is adapted for use in the human body.

33. The device according to claim 32 wherein the magnetic resonance frequency bandwidth of the magnetic resonance signals detected by said coil is not less than 1% of a mean frequency value of said detected magnetic resonance signals.

34. The probe according to claim 32, wherein said at least one region is located at a distance from the probe surface up to a distance substantially of the probe dimensions.

35. A device for magnetic resonance imaging (MRI) and NMR measurements of a medium surrounding an imaging probe of the device, the imaging probe comprising:

a magnetic field-forming assembly defining a longitudinal, Z-axis, and comprising two magnets spaced-apart along the Z-axis to define an inter-magnet gap and an imaging slice within a ring-shaped space around the inter-magnet gap, wherein the magnets are magnetized so as to produce a primary substantially non-homogeneous magnetic field in the medium; and at least one coil block in combination with signal processing circuitry connected to said coil block and capable of inducing a time-varying magnetic field to excite at least one region of the primary magnetic field to thereby produce magnetic resonance signals from within said at least one region, and capable of substantially simultaneously detecting the magnetic resonance signals from within the at least one region of said primary magnetic field, wherein the coil block is accommodated in said inter-magnet gap and has at least one coil gap, said at least one region being located within a sector-like region extending radially from said at least one coil gap.

36. The device according to claim 35 wherein the magnetic resonance frequency bandwidth of the magnetic resonance signals detected by said coil block is not less than 1% of a mean frequency value of said detected magnetic resonance signals.

37. The device according to claim 35 wherein the magnetic field in said at least one region is substantially non-homogeneous.

38. The device according to claim 35 wherein the time-varying magnetic field is substantially orthogonal with respect to the Z-axis.

39. A transceiver unit for use in a probe for detecting NMR signals of a surrounding medium, the transceiver unit comprising at least one coil block capable of detecting magnetic resonance signals within at least one region of a primary external magnetic field, wherein said coil block comprises a coil wound on a substantially toroidal core having at least one core gap.

40. The unit according to claim 39, wherein said at least one coil block induces an oscillating magnetic field directed substantially orthogonal to the static primary magnetic field.

* * * * *

UNITED STATES PATENT AND TRADEMARK OFFICE
CERTIFICATE OF CORRECTION

PATENT NO. : 6,600,319 B2
DATED : July 29, 2003
INVENTOR(S) : Erez Golan

It is certified that error appears in the above-identified patent and that said Letters Patent is hereby corrected as shown below:

<u>Title page,</u>
Item [56], References Cited, U.S. PATENT DOCUMENTS, add:

-- 6,133,734    10/2000    McKeon      324/303
   3,617,867   11/1971    Herzog      324/303
   5,492,119   02/1996    Abrams      128/642
   4,829,247   05/1989    Walrafen    324/208
   6,377,048   04/2002    Golan et al. 324/318 --
FOREIGN PATENT DOCUMENTS, add:

-- EP    1 006 366    06/2000 --

Signed and Sealed this

Seventh Day of September, 2004

JON W. DUDAS
*Director of the United States Patent and Trademark Office*